(12) United States Patent
Liu et al.

(10) Patent No.: US 9,261,801 B2
(45) Date of Patent: Feb. 16, 2016

(54) STEAM INJECTION PROCESS FOR PREPARING POLYESTER LATEX AND APPARATUS THEREOF

(71) Applicant: XEROX CORPORATION, Norwalk, CT (US)

(72) Inventors: Yu Liu, Burlington, CA (US); Frank Ping-Hay Lee, Oakville (CA); Michael D'Amato, Thornhill (CA); Yulin Wang, Oakville (CA); David Borbely, Simcoe (CA); Harry Latchman, Mississauga (CA); John Abate, Mississauga (CA); Ivan Uschak, Mississauga (CA); Rashid Mahmood, Mississauga (CA); Ke Zhou, Oakville (CA); Marko Saban, Toronto (CA); Biritawit Asfaw, Oakville (CA)

(73) Assignee: XEROX CORPORATION, Norwalk, CT (US)

( * ) Notice: Subject to any disclaimer, the term of this patent is extended or adjusted under 35 U.S.C. 154(b) by 4 days.

(21) Appl. No.: 14/245,894

(22) Filed: Apr. 4, 2014

(65) Prior Publication Data

US 2015/0286155 A1    Oct. 8, 2015

(51) Int. Cl.
*G03G 9/087* (2006.01)
*G03F 9/00* (2006.01)
*C08L 67/00* (2006.01)

(52) U.S. Cl.
CPC .. *G03F 9/00* (2013.01); *C08L 67/00* (2013.01)

(58) Field of Classification Search
CPC ............ G03G 9/0804; G03G 9/08797; G03G 9/08755

See application file for complete search history.

(56) References Cited

U.S. PATENT DOCUMENTS

| | | | |
|---|---|---|---|
| 5,853,943 A | 12/1998 | Cheng | |
| 6,653,462 B2 | 11/2003 | Khan | |
| 6,780,557 B2 | 8/2004 | Kawaji | |
| 6,830,860 B2 | 12/2004 | Sacripante | |
| 7,135,546 B1 * | 11/2006 | Vandenhende et al. | 528/500 |
| 7,851,549 B2 | 12/2010 | Sacripante | |
| 7,989,135 B2 | 8/2011 | Zhou | |
| 8,168,699 B2 * | 5/2012 | Lincoln et al. | 523/351 |
| 8,192,913 B2 | 6/2012 | Faucher | |
| 2008/0153027 A1 | 6/2008 | Veregin | |
| 2010/0310979 A1 | 12/2010 | Ou | |
| 2015/0217253 A1 * | 8/2015 | Wang | G03G 9/0804 430/137.14 |

FOREIGN PATENT DOCUMENTS

EP    1 369 748    * 12/2003  ............. G03G 9/087

* cited by examiner

*Primary Examiner* — Hoa V Le
(74) *Attorney, Agent, or Firm* — Pillsbury Winthrop Shaw Pittman LLP

(57) ABSTRACT

The present embodiments disclose processes for preparing a polyester latex containing an amount of residual organic solvent which is less than 100 ppm by weight of the total weight of the polyester latex.

13 Claims, 7 Drawing Sheets

DISTILLATION EFFICIENCY INCREASE
MIXING HOMOGENEITY INCREASE

SIMPLE AXIAL/RADIAL IMPELLER

COMPLEX ANCHOR IMPELLER (XC), WALL-WETTER (FX)

STEAM INJECTION

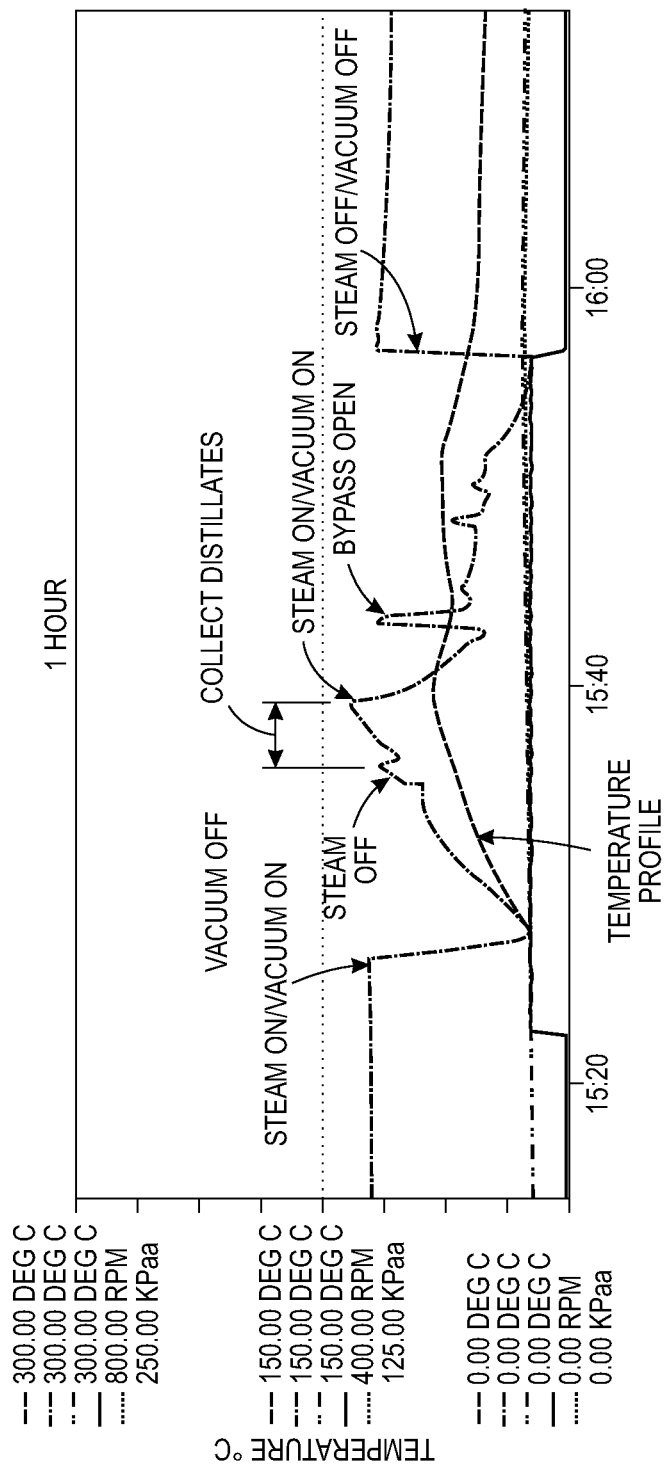

STEAM INJECTION PROCESS FOR PREPARING POLYESTER LATEX AND APPARATUS THEREOF

BACKGROUND

Polyester latex toners have been prepared utilizing amorphous and crystalline polyester latex. The incorporation of the polyester resin into toner requires that the polyester resin first be formulated into emulsions prepared by solvent containing batch processes, for example, solvent-based phase inversion emulsification (PIE). See, e.g., U.S. Pat. No. 8,192,913 and U.S. patent application Ser. No. 13/917,475, hereby incorporated by reference in its entirety. PIE is the procedure whereby the phases of a liquid-liquid dispersion interchange such that the dispersed phase spontaneously inverts to become the continuous phase and vice versa under conditions determined by the system properties, volume ratio and energy input. The phase inversion process involves the solubilization of resin and other components in an organic solvent such as methylethylketone (MEK). A phase inversion organic solvent is also added, which is typically chosen such that it is soluble with both the organic and aqueous phase, such as isopropanol (IPA).

There exist certain product specifications for the polyester resin to satisfy. For example, the solvent residuals are generally controlled to be less than 300 ppm by weight of the total weight of the polyester latex. Currently, companies are facing difficulties in efficiently removing the solvents from the polyester latex produced from the conventional PIE. One of the process challenges is to provide enough heat to evaporate the solvents, and another challenge is to provide effective mass transfer for the solvent evaporation to below a certain low solvent residual level, such as 50 ppm level. Specifically, co-solvent removal by distillation is difficult and time consuming. Some of the solvents that have good miscibilty with water, e.g., IPA, are particularly difficult to remove. In sum, the conventional PIE process is relatively time consuming, labor intensive, and has some lot-to-lot variability.

Significant amount of efforts and time have been invested in speeding up the emulsification and solvent removal processes, but satisfactory results have not been achieved. Therefore, a new emulsification process with significantly reduced cycle time and higher efficiency in co-solvent removal is highly desirable for overcoming the PIE process issues and thus achieving lower processing cost to make a polyester latex.

SUMMARY

According to embodiments illustrated herein, there is provided a Steam Injection Emulsification (SIE) process for preparing a polyester latex. The process of preparing a polyester latex of the present embodiments including mixing at least one polyester resin with an organic solvent to form a resin mixture; neutralizing the resin mixture by adding a neutralizing agent in water to the resin mixture; agitating the resin mixture and neutralizing agent in water to form an aqueous emulsion (i.e., polymer solution); contacting the aqueous emulsion with deionized water steam for heating to a required temperature; and distillating the mixture of the aqueous emulsion and the deionized water steam under atmospheric pressure or vacuum thereby obtaining the polyester latex containing an amount of residual organic solvent which is less than 100 ppm by weight of the polyester latex under the required temperature.

In embodiments, there is provided A process of preparing a polyester latex including mixing at least one polyester resin methylethylketone and isopropanol; neutralizing the resin mixture with a neutralizing agent in water; agitating the resin mixture and neutralizing agent in water to form an aqueous emulsion; continuously contacting the aqueous emulsion with deionized water steam for heating to a required temperature; and distillating the aqueous emulsion under atmospheric pressure or vacuum thereby obtaining a polyester latex containing an amount of residual methylethylketone which is from about 0 ppm to about 50 ppm by weight of the latex and an amount of residual isopropanont which is from about 0 ppm to about 50 ppm by weight of the latex.

In further embodiments, there is provided an steam generation system for preparing a polyester latex including a shell-tube heat exchanger comprising a shell part and a tubing part, wherein deionized water is loaded in the shell part and a steam source is fed to the tubing part thereby generating a deionized water steam; a flow meter and a metering valve for measuring the quantity of deionized water; a pipe for feeding the deionized water steam to a process vessel; an injector is connected at the end of the pipe for injecting the deionized water steam to the process vessel; and the process vessel.

BRIEF DESCRIPTION OF THE FIGURES

For a better understanding of the present embodiments, reference may be made to the accompanying figures.

FIG. 8 illustrates a temperature profile mapping with steam injecting into a reactor with pre-loaded water according to the present embodiments.

DETAILED DESCRIPTION

Figure 1:
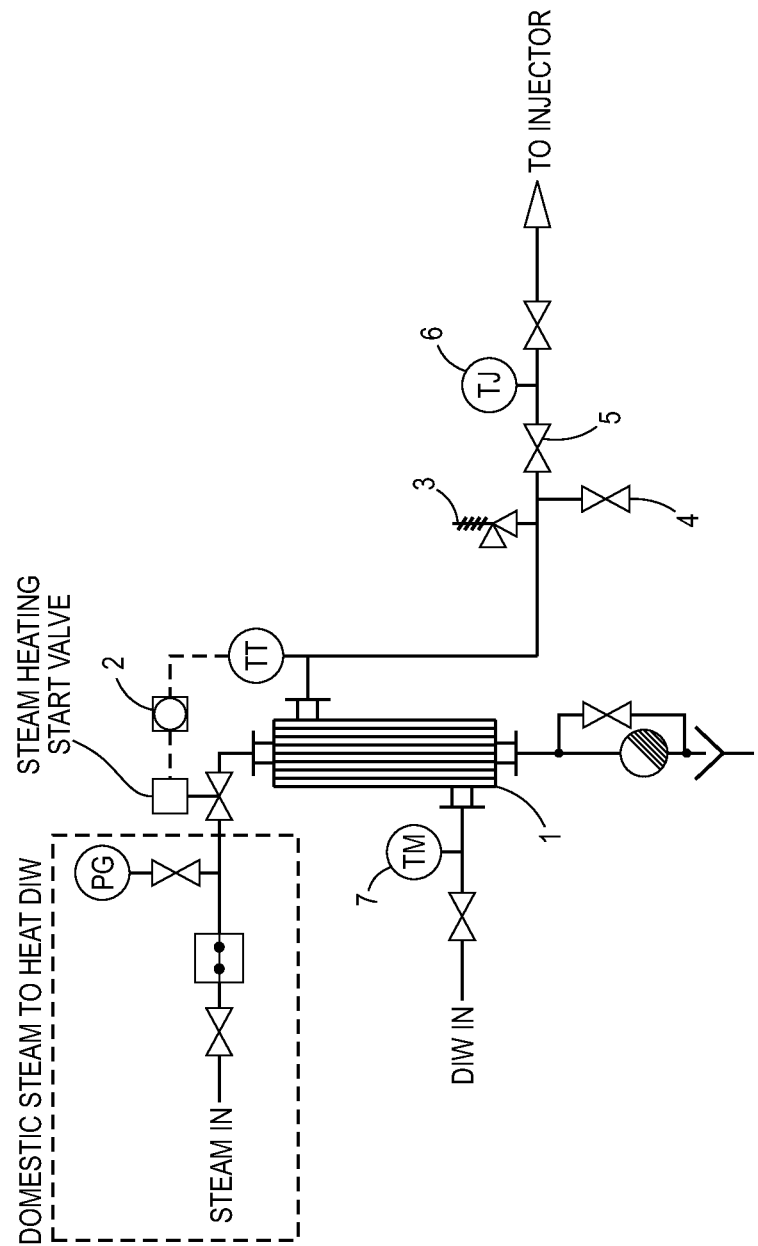
FIG. 1 is a flow chart depicting a process for steam generation according to the present embodiments.

The present disclosure provides processes for preparing a polyester latex containing an amount of residual organic solvent which is less than 100 ppm, 80 ppm or 50 ppm by weight of the total weight of the polyester latex (i.e., from about 0 ppm to about 99 ppm, from about 0 ppm to about 79 ppm, or from about 0 ppm to about 49 ppm). Particularly, the method of the present embodiments include a step of removing the organic solvent used to dissolve the polyester resin to form a resin mixture, such that the prepared polyester latex contains an amount of residual organic solvent which is less than 100 ppm, 80 ppm or 50 ppm by weight of the total weight of the polyester latex. The processes of the embodiments can be applied to preparation of a polyester latex for emulsion aggregation (EA) toner and other industrial applications related to polyester latex.

Suitable organic solvents include, for example, alcohols, esters, ethers, ketones, amines, and combinations thereof. Specific examples of organic solvents include, for example, methanol, ethanol, propanol, isopropanol (IPA), butanol, ethyl acetate, methylethylketone (MEK), and the like, and combinations thereof. The total organic solvent may be present in an amount of, for example, from about 30% by weight to about 400% by weight of the resin, in embodiments, from about 40% by weight to about 250% by weight of the resin, in embodiments, from about 50% by weight to about 100% by weight of the resin. In embodiments, a solvent mixture can be used, which includes a mixture of two or more solvents, e.g., a first organic solvent and a second organic solvent. The ratio of any two organic solvents in a solvent mixture may be from about 5:1 to about 50:1, from about 7:1 to about 30:1, or from about 9:1 to about 25:1, or from about 3:1 to about 20:1. In embodiments, a solvent mixture comprises ketone and alcohol. In further embodiments, a solvent mixture comprises MEK (e.g., the first organic solvent) and IPA (e.g., the second organic solvent).

The processes of the present disclosure include (1) mixing at least one polyester resin with an organic solvent to form a resin mixture; (2) neutralizing and agitating the resin mixture to form an aqueous emulsion; (3) removing the organic solvent from the aqueous emulsion. The solvent removal step of the present embodiments includes contacting the aqueous emulsion with steam and distillating the aqueous emulsion (or the mixture of the aqueous emulsion and the deionized water steam) under atmospheric pressure or vacuum under the required temperature. The required temperature (i.e., the reactor temperature during the emulsification and/or the distillation processes) is in the range of from about 100 to about 130° C., or from about 105 to about 125° C., or from about 100 to about 125° C.

The rate of distilling the aqueous emulsion can be from about 2 gallons/hour to about 12 gallons/hour, from about 3 gallons/hour to about 10 gallons/hour, or from about 4 gallons/hour to about 8 gallons/hour. In embodiments, the total time for distilling the aqueous emulsion (i.e., removing the organic solvent from the aqueous emulsion) under atmospheric pressure and/or vacuum may be from about 0.5 hour to about 1.5 hours for a 5-gallon scale batch process.

The solvent removal step can efficiently remove the organic solvent. After the solvent removal step of the present embodiments, the residual total organic solvent present in the prepare polyester latex may be from about 0 ppm to about 100 ppm, from about 0 ppm to about 50 ppm, or from about 0 ppm to about 30 ppm by weight of the total weight of the polyester latex. In embodiments, after the solvent removal step of the present embodiments, the residual of the first organic solvent present in the prepare polyester latex may be from about 0 ppm to about 50 ppm, from about 0 ppm to about 30 ppm, from about 0 ppm to about 15 ppm by weight of the total weight of the polyester latex. In embodiments, after the solvent removal step of the present embodiments, the residual of the second organic solvent present in the prepare polyester latex may be from about 0 ppm to about 50 ppm, from about 0 ppm to about 30 ppm, from about 0 ppm to about 15 ppm by weight of the total weight of the polyester latex. In contrast, conventional PIE methods are generally inefficient in removing the organic solvent(s); typically the total organic solvent residual is in a level at higher than 100 ppm.

Conventional PIE methods employ vacuum distillation where the removal of the second organic solvent is found to be more difficult than that of the first organic solvent. For example, the removal of IPA is more difficult than that of MEK when a conventional PIE method is used. Particularly, it is difficult to remove the organic solvent such that the amount of solvent residue of the prepared polyester latex is at a level below 50 ppm. In contrast, as discussed herein, the methods of the present disclosure allow efficient removal of both the first and second organic solvents. Comparing to the conventional PIE methods, the solvent removal step of the methods of the present disclosure may shorten the time required to remove the organic solvent by as much as 50%, or by from about 20% to about 50%, or from about 30% to about 40%. For example, in a 5 gallon scale reactor, the time to remove the solvent may be shorten from about 2 hours (conventional PIE) to about 1 hour (process of the present disclosure). In embodiments, after the solvent removal step of the present embodiments, the amount of the residual of second organic solvent present in the prepare polyester latex may be less than that of the residual of the first organic solvent.

The present embodiments employ a steam generation system based on a heat exchanger with pre-loaded liquid DIW, which can be heated to boiling by a domestic steam supply (i.e., a steam source). A steam generation system design as shown in FIG. 1 may be used for producing steam from deionized water (DIW) for use in phase inversion emulsification and solvent distillation. A typical plant steam generation system does not employ DIW and therefore require the use of water-treatment additives which are not suitable for latex preparation. The DIW steam generated by the steam generation system of the present embodiments may contain greater than 13 megaohm-cm impurity.

The measurement of the amount of DIW for use in the generation of steam can be measured by dispensing DIW using a flow meter 7, or by using a weighed tank. A shell-tube heat exchanger 1, which includes a shell part and a tubing part, may be used as a boiler. A flow meter 7 may be used to measure the quantity of DIW charged into the shell part of the heat exchanger. The DIW is then heated into steam for injecting into the process vessel through the injector. In certain embodiments, the DIW liquid can be preloaded in the shell, and the domestic steam may be passed through the tubing part to heat the preloaded DIW. In other embodiments, the DIW may be preloaded in the tubing part and the domestic steam may be passed through the shell part. A pipe, typically made with stainless steel, can be used for feeding the steam generated in the shell part of the heat exchanger to the steam injector inside the process vessel. The DIW steam generation/injection may be a continuous process, if the flow rate of the DIW into the heat exchanger is under appropriate control. A pressure gauge 3 may be used to relief pressure. A bypass valve 4 may be used for visual inspection of the presence of steam. An injector is used to inject the steam into the process vessel where the steam and the emulsion are in contact. A metering valve 5 may be used to control the rate of injecting the DIW steam, for example, into an aqueous emulsion of the present embodiments. Such a system design can generate the required DIW steam within a short period of time. For example, the total time for generating and injecting the DIW steam of a 5 gallon batch can be between about 0.5 hour and about 1.5 hour. Typically, the rate of generating the DIW steam can be between about 2 gallons/hour and about 12 gallons/hour, between about 3 gallons/hour and about 10 gallons/hour, or between about 4 gallons/hour and about 8 gallons/hour. The present system design can produce steam with a temperature between 100° and 130° C., or between 100° and 120° C. The temperature of the generated steam may be monitored by a temperature monitoring device 6. A bypass valve 4, a metering valve 5, and/or the temperature control device 2 may be connected along the pipe (i.e., installed in the steam supply line).

Figure 2:
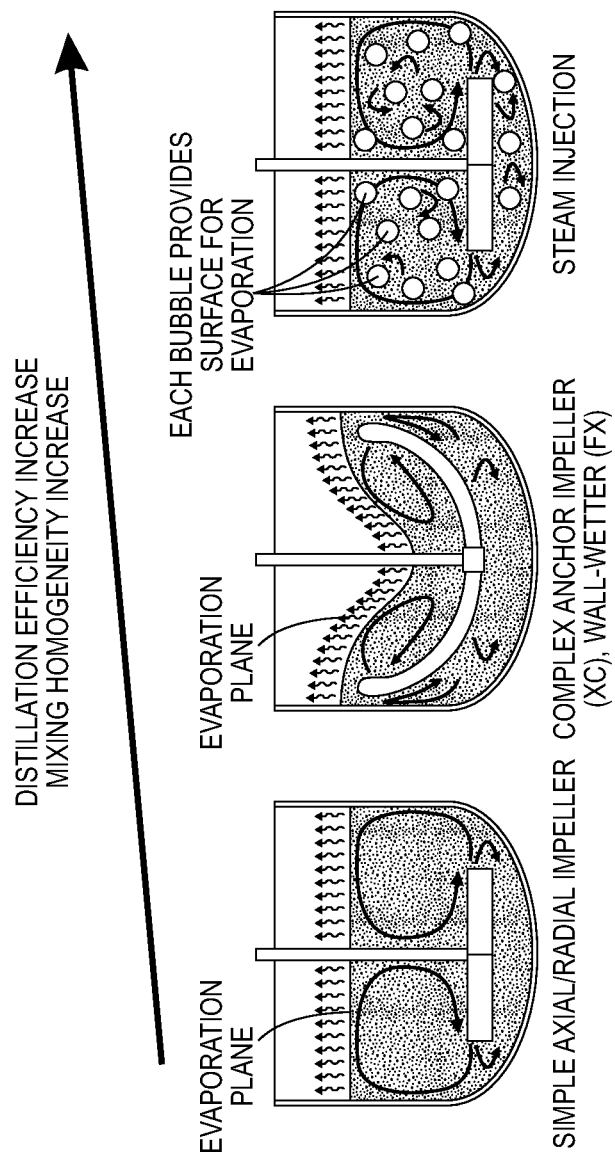
FIG. 2 illustrates the distillation efficiency of the (a) simple axial/radial impeller, (b) complex anchor impeller, wall-wetter, and (c) steam injection according to the present embodiments.

When the aqueous emulsion (containing the prepared polyester latex) is continuously contacted with steam (e.g., by steam injection), a large amount of micro-bubbles can be generated. The micro-bubbles provide extra air surface for evaporation, hence increases the solvent evaporation rate. The heat that is released during the steam condensation provides the energy for the solvents evaporation. The combination of increased air surface and heat provide a faster and more efficient process for solvent removal. FIG. 2 illustrates how the steam contact (or injection) with the aqueous emulsion can provide a faster and more efficient process for solvent removal (see third image) as compared to the conventional process, i.e., without steam contact, such as simple axial impeller and complex anchor impeller (see first and second images). Direct steam injection into polymer solution of the present embodiments improves both heat transfer and mass transfer efficiency over conventional mixing with an agitator and heat transfer via vessel jacket.

The process of the present embodiments includes mixing at least one polyester resin with an organic solvent to form a resin mixture. The resin mixture can then be neutralized with a neutralizing agent. The neutralizing agent may include an inorganic base, such as, ammonium hydroxide (e.g., at a concentration of from about 1% to about 25%, from about 3% to about 20%, from about 5% to about 15%) or an organic amine, such as, triethylamine, triethaneolamine, and mixtures thereof. The neutralizing agent may be present in the aqueous emulsion in an amount of from about 0.001% by weight to 50% by weight of the resin, in embodiments from about 0.01% by weight to about 25% by weight of the resin, in embodiments from about 0.1% by weight to 5% by weight of the resin. In embodiments, the neutralizing agent may be added in the form of an aqueous solution. In other embodiments, the neutralizing agent may be added in the form of a solid.

Utilizing the neutralization agent in combination with a resin possessing acid groups, a neutralization ratio of from about 50% to about 300% may be achieved, in embodiments from about 70% to about 200%. In embodiments, the neutralization ratio may be calculated as the molar ratio of basic groups provided with the basic neutralizing agent to the acid groups present in the resin multiplied by 100%.

The polyester resin that may be emulsified by the neutralization agent includes any amorphous polyester resin and/or crystalline polyester resin, especially those with a low acid value of from about 3 mg KOH/g of resin to about 200 mg KOH/g of resin, from about 5 mg KOH/g of resin to about 50 mg KOH/g of resin, or from about 7 mg KOH/g of resin to about 15 mg KOH/g of resin. These polymer resins typically include acid terminated end groups.

The acid number may be detected by titration with KOH/methanol solution containing phenolphthalein or bromothymol blue as the indicator. The acid number may then be calculated based on the equivalent amount of KOH/methanol required to neutralize all the acid groups on the resin identified as the end point of the titration. In embodiments, the polyester resin may include branched or straight chained amorphous polyester. In embodiments, the polyester resin includes a high molecular weight polyester amorphous resin or a high molecular weight branched polyester amorphous resin.

Specific examples of amorphous polyester materials that may be used include both branched and linear amorphous materials, and combinations of branched and linear amorphous materials. The amorphous polyester materials may be formed by the polycondensation of an organic alcohol such as a diol or glycol and an acid, including anhydrides, optionally with a multivalent polyacid or polyol as a branching agent, and a polycondensation catalyst. The amorphous polyesters may further be crosslinked, that is, may include crosslinked portions therein. Suitable acids may include, for example, succinic acid, glutaric acid, adipic acid, pimelic acid, suberic acid, azelaic acid, sebacic acid, isophthalic acid, terephthalic acid, hexachloroendo methylene tetrahydrophthalic acid, maleic acid, fumaric acid, chloromaleic acid, methacrylic acid, acrylic acid, itaconic acid, citraconic acid, mesaconic acid, maleic anhydride, phthalic anhydride, chlorendic anhydride, tetrahydrophthalic anhydride, hexahydrophthalic anhydride, endomethylene tetrahydrophthalic anhydride, tetrachlorophthalic anhydride, tetrabromophthalic anhydride, and the like and mixtures thereof. Suitable alcohols may include, for example, propylene glycol, ethylene glycol, diethylene glycol, neopentyl glycol, dipropylene glycol, dibromoneopentyl glycol, propoxylated bisphenol A, ethoxylated bisphenol A and other alkoxylated bisphenol A diols, 2,2,4-trimethylpentane-1,3-diol, tetrabromo bisphenol dipropoxy ether, 1,4-butanediol, and the like and mixtures thereof. Desirable amorphous polyester materials may be prepared from diacids and/or anhydrides such as, for example, maleic anhydride, fumaric acid, and the like and mixtures thereof, and diols such as, for example, propoxylated bisphenol A, propylene glycol, and the like and mixtures thereof. A poly (propoxylated bisphenol A fumarate) polyester is suitable.

The amorphous polyester may also be comprised of an alkali sulfonated polyester resin, such as the metal or alkali salts of copoly(ethylene-terephthalate)-copoly(ethylene-5-sulfo-isophthalate), copoly(propylene-terephthalate)-copoly(propylene-5-sulfo-isophthalate), copoly(diethylene-terephthalate)-copoly(diethylene-5-sulfo-isophthalate), copoly(propylene-diethylene-terephthalate)-copoly(propylene-diethylene-5-sulfoisophthalate), copoly(propylene-butylene-terephthalate)-copoly(propylene-butylene-5-sulfo-isophthalate), copoly(propoxylated bisphenol-A-fumarate)-copoly(propoxylated bisphenol A-5-sulfo-isophthalate), copoly(ethoxylated bisphenol-A-fumarate)-copoly(ethoxylated bisphenol-A-5-sulfo-isophthalate), and copoly(ethoxylated bisphenol-A-maleate)-copoly(ethoxylated bisphenol-A-5-sulfo-isophthalate), wherein the alkali metal is, for example, a sodium, lithium or potassium ion.

The amorphous polyester may include crosslinked portions therein, for example such that the toner has a weight fraction of the microgel (a gel content) in the range of, for example, from about 0.001 to about 50 weight percent, such as from about 0.1 to about 40 weight percent or from about 1 to about 10 weight percent, of the amorphous polyester. The gel content may be achieved either by mixing in an amount of crosslinked material, or crosslinking portions of the amorphous polyester, for example by including a crosslinking initiator in the amorphous polyester. The initiators may be, for example, peroxides such as organic peroxides or azo-compounds, for example diacyl peroxides such as decanoyl peroxide, lauroyl peroxide and benzoyl peroxide, ketone peroxides such as cyclohexanone peroxide and methyl ethyl ketone, alkyl peroxy esters such as t-butyl peroxy neodecanoate, 2,5-dimethyl 2,5-di(2-ethyl hexanoyl peroxy)hexane, t-amyl peroxy 2-ethyl hexanoate, t-butyl peroxy 2-ethyl hexanoate, t-butyl peroxy acetate, t-amyl peroxy acetate, t-butyl peroxy benzoate, t-amyl peroxy benzoate, oo-t-butyl o-isopropyl mono peroxy carbonate, 2,5-dimethyl 2,5-di(benzoyl peroxy)hexane, oo-t-butyl o-(2-ethyl hexyl) mono peroxy carbonate, and oo-t-amyl o-(2-ethyl hexyl) mono peroxy carbonate, alkyl peroxides such as dicumyl peroxide, 2,5-dimethyl 2,5-di(t-butyl peroxy)hexane, t-butyl cumyl peroxide, bis(t-butyl peroxy)diisopropyl benzene, di-t-butyl peroxide and 2,5-dimethyl 2,5-di(t-butyl peroxy)hexyne-3, alkyl hydroperoxides such as 2,5-dihydro peroxy 2,5-dimethyl hexane, cumene hydroperoxide, t-butyl hydroperoxide and t-amyl hydroperoxide, and alkyl peroxyketals such as n-butyl 4,4-di(t-butyl peroxy)valerate, 1,1-di(t-butyl peroxy) 3,3,5-trimethyl cyclohexane, 1,1-di(t-butyl peroxy)cyclohexane, 1,1-di(t-amyl peroxy)cyclohexane, 2,2-di(t-butyl peroxy)butane, ethyl 3,3-di(t-butyl peroxy)butyrate and ethyl 3,3-di(t-amyl peroxy)butyrate, azobis-isobutyronitrile, 2,2'-azobis(isobutyronitrile), 2,2'-azobis(2,4-dimethyl valeronitrile), 2,2'-azobis(methyl butyronitrile), 1,1'-azobis(cyano cyclohexane), 1,1-di(t-butyl peroxy)-3,3,5-trimethylcyclohexane, combinations thereof and the like. The amount of initiator used is proportional to the degree of crosslinking, and thus the gel content of the polyester material. The amount of initiator used may range from, for example, about 0.01 to about 10 weight percent, such as from about 0.1 to about 5 weight percent or the amorphous polyester. In the crosslinking, it is desirable that substantially all of the initiator be used up. The crosslinking may be carried out at high temperature, and thus the reaction may be very fast, for example, less than 10 minutes, such as from about 20 seconds to about 2 minutes residence time.

Branching agents to generate a branched amorphous polyester may include, for example, a multivalent polyacid such as 1,2,4-benzene-tricarboxylic acid, 1,2,4-cyclohexanetricarboxylic acid, 2,5,7-naphthalenetricarboxylic acid, 1,2,4-naphthalenetricarboxylic acid, 1,2,5-hexanetricarboxylic acid, 1,3-dicarboxyl-2-methyl-2-methylene-carboxylpropane, tetra(methylene-carboxyl)methane, and 1,2,7,8-octanetetracarboxylic acid, acid anhydrides thereof, and lower alkyl esters thereof having from about 1 to about 6 carbon atoms; a multivalent polyol such as sorbitol, 1,2,3,6-hexanetetrol, 1,4-sorbitane, pentaerythritol, dipentaerythritol, tripentaerythritol, sucrose, 1,2,4-butanetriol, 1,2,5-pentatriol, glycerol, 2-methylpropanetriol, 2-methyl-1,2,4-butanetriol, trimethylolethane, trimethylolpropane, 1,3,5-trihydroxymethylbenzene, mixtures thereof, and the like. The branching agent amount selected is, for example, from about 0.01 to about 10 mole percent of the polyester material, such as from about 0.05 to about 8 mole percent or from about 0.1 to about 5 mole percent of the polyester material.

The amorphous polymer may comprise, for example, from about 50 to about 95 percent by weight, such as from about 75 to about 95 percent by weight or from about 80 to about 90 percent by weight, of the binder. In embodiments, the amorphous polymer material, such as the amorphous polyester material, possesses, for example, a number average molecular weight (Mn), as measured by gel permeation chromatography (GPC), of from about 1,000 to about 500,000, such as from about 2,000 to about 250,000; a weight average molecular weight (Mw) of, for example, from about 1,000 to about 600,000, such as from about 2,000 to about 300,000, as determined by GPC using polystyrene standards; and a molecular weight distribution (Mw/Mn) of, for example, from about 1.5 to about 6, such as from about 2 to about 4.

Upon agitation of the resin mixture and the neutralizing agent in water, an aqueous emulsion can be formed. The aqueous emulsions contain polyester latex particles with particle size in the desired range of from about 100 nm to about 280 nm (in volume average diameter) with a narrow particle size distribution as measured using a Nanotrac Model 252 Nanosizer. In further embodiments, the resulting emulsions have a particle size in the desired range of from about 150 nm to about 250 nm, or from about 180 nm to about 220 nm with a narrow particle size distribution. The resulting polyester latex emulsions are useful in producing low melt or ultra low melt emulsion aggregate toners.

After achieving the desired polyester latex particle size, the aqueous emulsion can be contacted with steam and the solvent removal step begins as described herein.

After the solvent removal step, the polyester latex prepared from the process of the present disclosure may contain partial amount of the deionized water condensed from the deionized water steam. The amount of the deionized water can be controlled by varying the time duration of the distillation step. For example, the longer the time duration of the distillation step, the higher the amount of deionized water is present in the polyester latex. The deionized water in the polyester latex can be ranged from about 50 to about 95 percent, from about 60 to about 90 percent, from about 70 to about 85 percent by weight based on the total weight of the polyester latex.

The following Examples are submitted to illustrate embodiments of the disclosure. The Examples are intended to be illustrative only and are not intended to limit the scope of the disclosure. Also, parts and percentages are by weight unless otherwise indicated.

EXAMPLES

The examples set forth herein below are being submitted to illustrate embodiments of the present disclosure. These examples are intended to be illustrative only and are not intended to limit the scope of the present disclosure. Also, parts and percentages are by weight unless otherwise indicated. Comparative examples and data are also provided.

Example 1

Figure 3:
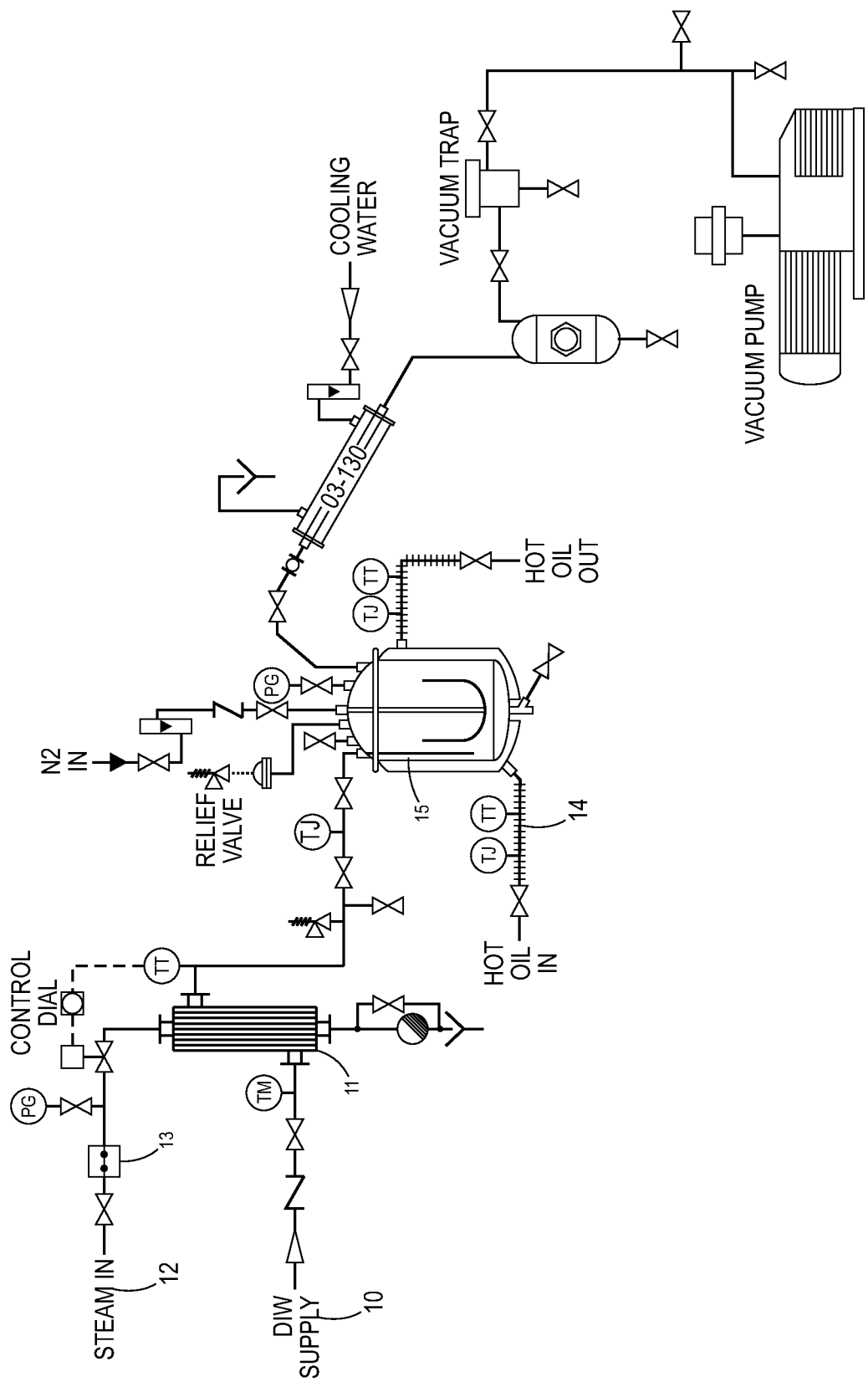
FIG. 3 is a flow chart depicting a process for steam generation and injection into a reactor according to the present embodiments.

FIG. 3 shows a 5-gallon pilot plant SIE process system. The SIE process system demonstrates (1) quantifying the mass of deionized water for generating steam for injection directly into the polymer solution, (2) successful controlling of the rate of steam injection and (3) successful controlling of the rate of vapor (steam and solvents) removal.

Experimental apparatus: A simple DIW steam—injection system was used for generating required steam between 110° C. and 125° C., as shown in FIG. 3, where DIW 10 was first loaded into the shell side of a shell-and-tube heat exchanger 11 and 150° C. domestic steam source 12 was flowed into the tube side of the shell-and-tube heat exchanger to heat the DIW. DIW steam could be quickly generated, within minutes, and sent into the reactor to prepare polyester latex and then to remove unwanted solvents under vacuum. The steam was injected below the surface of the polymer solution.

Material Preparation: Two 5-gallon reactors (batches SIE 2 and SIE 3) were each charged with 2.5 kg of polyester resin A in a mixture of 2.5 kg MEK and 0.25 kg IPA. The mixtures were agitated at a speed of about 58 RPM at 40° C. for 2 hours. At the end of the 2 hours, 80 g of ammonium hydroxide was added to each of the resulting mixtures for neutralization.

Figure 4:
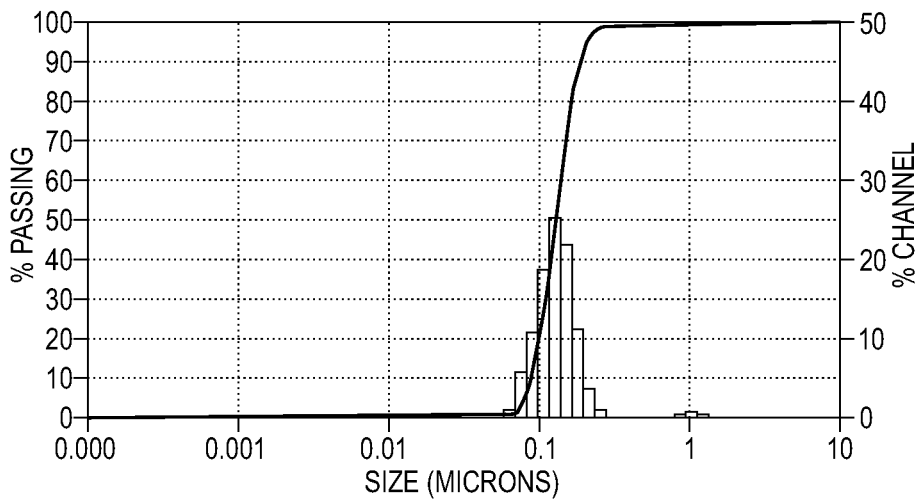
FIG. 4 is a graph showing the polyester latex particle size resulting from a process (SIE 2) according to the present embodiments. SIE refers to "Steam Injection Emulsification"
Figure 5:
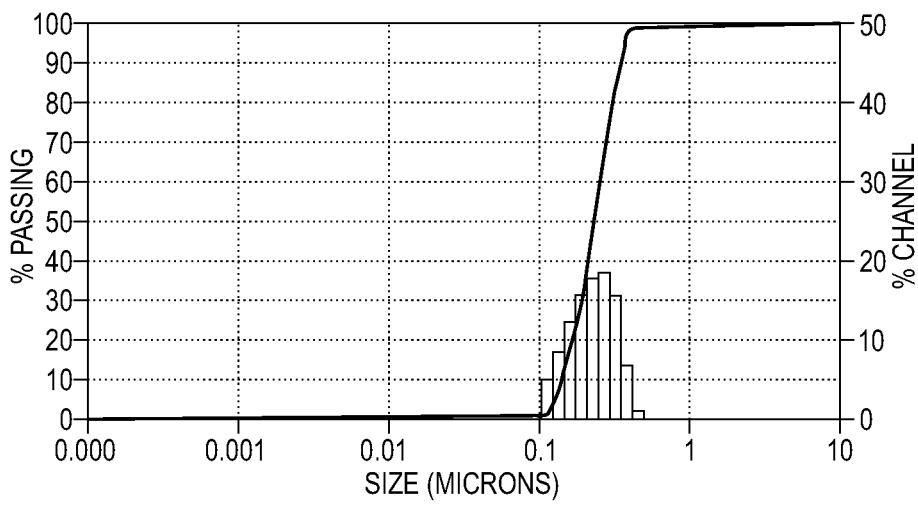
FIG. 5 is a graph showing the polyester latex particle size resulting from a process (SIE 3) according to the present embodiments.

Emulsification: In-situ generated 105-110° C. steam was injected into the reactor via a sparge tube at the agitation speed of about 58 RPM. The steam injection was manually adjusted by a steam pressure regulator 13, and jacket cooling 14 was applied to the reactor in order to maintain the temperature of the contents at below 80° C. After approximately 45 minutes, a latex was formed and a sample was taken out for particle size analysis. The latex particle sizes for both batches SIE 2 and SIE 3 were obtained and measured at about 223 nm and about 263 nm as shown in FIG. 4 and FIG. 5, respectively.

Distillation: Following emulsification, steam was injected via an injector 15 continuously into the prepared latex under vacuum with reactor agitation. Hence, the steam was brought in contact with the latex mixture including IPA and MEK, and the process of solvent removal began. Typically, without the use of vacuum, IPA and MEK would condense back easily; herein the vacuum system is necessary for solvent removal. Distilled samples were collected every 20 to 30 minutes for a GC analysis for residual solvent contents. The total solvent removal process was completed and terminated after 1 hour. The conventional PIE process of similar scales typically takes more than 2 hours to complete the solvent removal process at the same time satisfying the latex particle size requirement. Thus, the length of the distillation time was reduced by 50% as compared to the conventional PIE process.

Comparison of the Conventional PIE and SIE of the Present Embodiments

Figure 6:
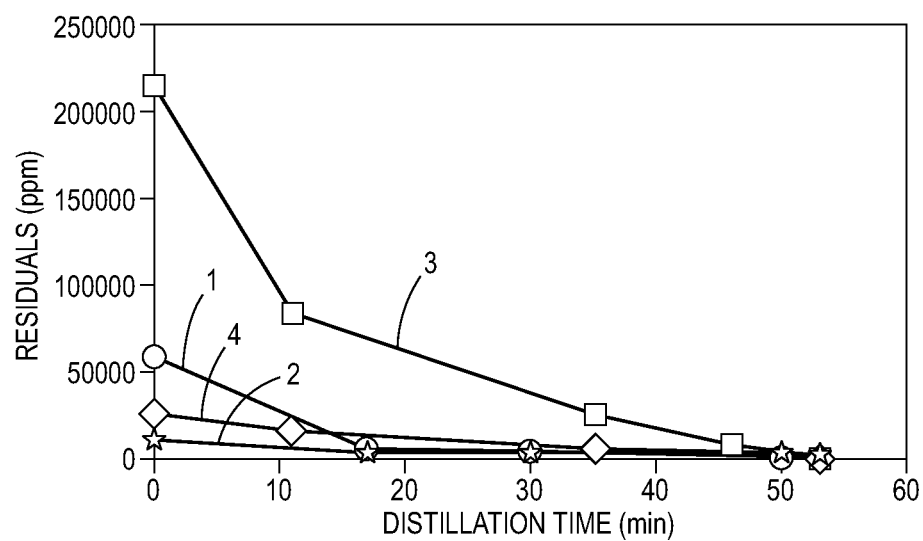
FIG. 6 is a graph showing the trends in solvent residuals over distillation time result from a process (SIE 2) according to the present embodiments and another process (SIE 3) according to the present embodiments.

The solvent removal trends for batches SIE 2 and SIE 3 are shown in FIG. 6 which demonstrates good repeatability. Specifically, the solvent residuals of the solvent MEK of SIE 3 over distillation time is represented by curve 1, the solvent residuals of the solvent IPA of SIE 3 over distillation time is represented by curve 2, the solvent residuals of the solvent MEK of SIE 2 over distillation time is represented by curve 3, the solvent residuals of the solvent IPA of SIE 2 over distillation time is represented by curve 4.

Figure 7A:
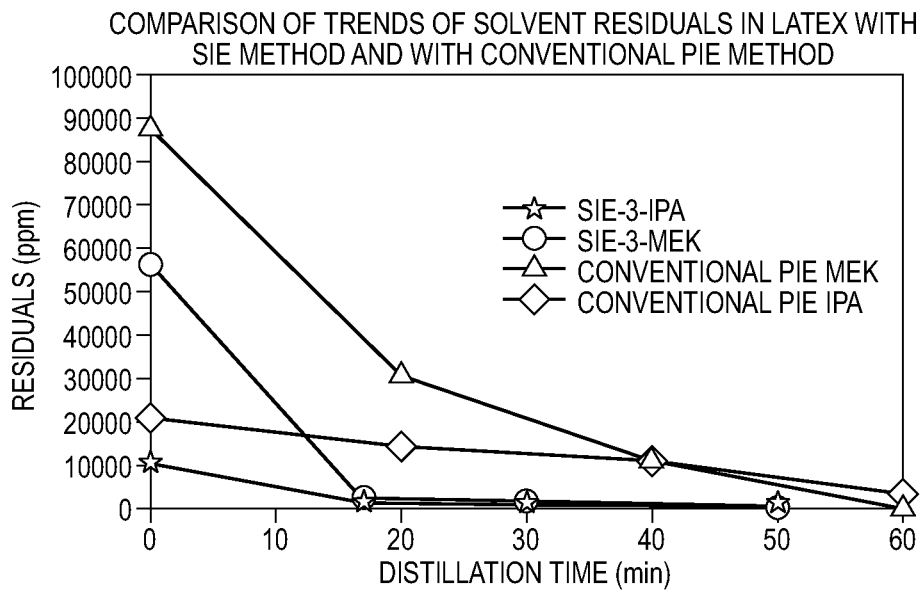
FIGS. 7a and 7b illustrates the comparison of trends of solvent residuals in the polyester latex with a SIE process according to the present embodiments and with the conventional PIE process.
Figure 7B:
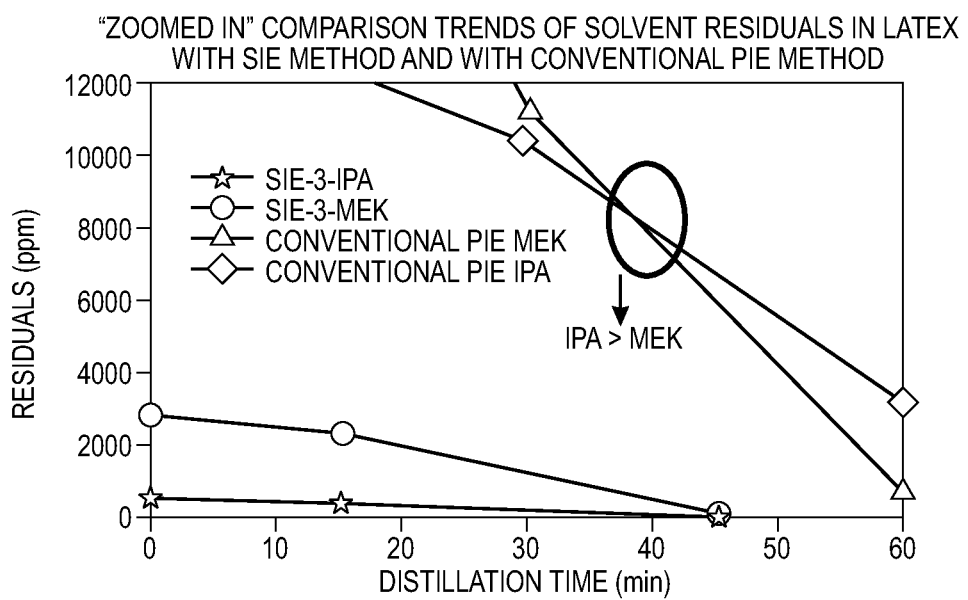

FIG. 7a illustrates the comparison of trends of solvent residuals in the polyester latex with SIE process and with the conventional PIE process. FIG. 7b is the zoomed in comparison of trends of solvent residuals in the polyester latex with SIE process and with the conventional PIE process. The figures illustrate that SIE process shortens the overall distillation time by 50%, or from more than 2 hr (solvent removal process time with the conventional PIE process) to less than 1 hr (solvent removal process time with the SIE process according to the present embodiments). The data shows that the solvent residual of IPA~9 ppm and MEK~14 ppm was achieved within 50 minutes. Table 1 below compares the distillation time for the conventional PIE at various scales (i.e., 2 L, 10 L and 5000 Gallon) and the SIE of the present embodiments (i.e., 5 Gallon). Both MEK and IPA have reached lowest levels using the SIE process. It was also noted that, in the SIE process, from the beginning to the end of distillation, the amount of MEK present in the polyester latex was always higher than that of IPA.

TABLE 1

| Process | Conventional PIE | | | Time (5 Gal SIE) |
|---|---|---|---|---|
| | Time (2 L) | Time (10 L) | Time (5000 Gallon) | |
| Step 1: Dissolution | ~2 hrs | ~2 hrs | ~2 hrs | ~2 hrs |
| Step 2: Neutralization | ~12 mins | ~12 mins | ~12 mins | ~12 mins |
| Step 3: Emulsification | ~60 mins | ~60 mins | ~60 mins | ~45 mins |
| Step 4: Distillation | ~120 mins | ~2 hrs (w deformer) | ~16 to 18 hrs ~9 hrs (w heat exchanger) | <1 hr |

Example 2

FIG. 8 shows a temperature profile mapping with steam injecting into reactor with preloaded DIW. The temperature profile was monitored over time showing changes with injection time and operation of controls such as by pass valve 2 and manual flow rate control valve 3 (See FIG. 2).

It will be appreciated that several of the above-disclosed and other features and functions, or alternatives thereof, may be desirably combined into many other different systems or applications. Also various presently unforeseen or unanticipated alternatives, modifications, variations or improvements therein may be subsequently made by those skilled in the art, which are also intended to be encompassed by the following claims.

Unless specifically recited in a claim, steps or components of claims should not be implied or imported from the specification or any other claims as to any particular order, number, position, size, shape, angle, color or material.

All references cited herein are herein incorporated by reference in their entireties.

What is claimed is:

1. A process of preparing a polyester latex comprising the steps in the following order:
   mixing at least one polyester resin with an organic solvent to form a resin mixture;
   neutralizing the resin mixture by adding a neutralizing agent in water to the resin mixture;
   emulsifying the resin mixture and neutralizing agent in water by injecting steam into the mixture to form an aqueous emulsion which contains the prepared polyester latex, wherein the aqueous emulsion has a particle size from about 100 to about 280 nm;
   contacting the aqueous emulsion with deionized water steam for heating to a required temperature; and
   distilling the mixture of the aqueous emulsion and the deionized water steam under vacuum thereby obtaining the polyester latex containing an amount of residual organic solvent which is less than 100 ppm by weight of the polyester latex under the required temperature of from about 100° C. to about 130° C.

2. The process of claim 1, wherein the organic solvent comprises a first organic solvent and a second organic solvent.

3. The process of claim 2, wherein the polyester latex containing an amount of residual first organic solvent which is from about 0 ppm to about 50 ppm by weight.

4. The process of claim 2, wherein the second organic solvent comprises methylethylketone.

5. The process of claim 2, wherein the polyester latex containing an amount of residual second organic solvent which is from about 0 ppm to about 50 ppm by weight.

6. The process of claim 2, wherein the second organic solvent comprises isopropanol.

7. The process of claim 1, wherein the polyester resin has a number average molecular weight of from about 2,000 to about 300,000.

8. The process of claim 1, wherein the required temperature is from about 100° C. to about 125° C.

9. The process of claim 1, wherein a rate of distilling the mixture of the aqueous emulsion and the deionized water steam is from about 2 gallon/hour to about 12 gallons/hour.

10. The process of claim 1, wherein the polyester latex further comprises partial amount of the deionized water condensed from the deionized water steam, wherein the amount of the deionized water is controlled by varying the time duration of the distillation step.

11. The process of claim 1, wherein the deionized water in the polyester latex is ranged from about 60 to about 90 percent by weight based on the total weight of the polyester latex.

12. The process of claim 1, wherein a time for solvent removal is reduced by up to 50% as compared to a time for solvent removal of a conventional phase inversion emulsification process.

13. A process of preparing a polyester latex comprising the steps in the following order:
- mixing at least one polyester resin with methylethylketone and isopropanol;
- neutralizing the resin mixture with a neutralizing agent in water;
- emulsifying the resin mixture and neutralizing agent in water injecting steam into the mixture to form an aqueous emulsion, which contains the prepared polyester latex, wherein the aqueous emulsion has a particle size from about 100 to about 280 nm;
- continuously contacting the aqueous emulsion with deionized water steam for heating to a required temperature; and
- distilling the aqueous emulsion under vacuum thereby obtaining a polyester latex containing an amount of residual methylethylketone which is from about 0 ppm to about 50 ppm by weight of the latex and an amount of residual isopropanol which is from about 0 ppm to about 50 ppm by weight of the latex under the required temperature of from about 100° C. to about 130° C.

* * * * *